(12) United States Patent
Santini

(10) Patent No.: US 6,930,864 B2
(45) Date of Patent: Aug. 16, 2005

(54) METHODS AND APPARATUS FOR DEFINING THE TRACK WIDTH OF A MAGNETIC HEAD HAVING A FLAT SENSOR PROFILE

(75) Inventor: Hugo Alberto Emilio Santini, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 145 days.

(21) Appl. No.: 10/104,612

(22) Filed: Mar. 22, 2002

(65) Prior Publication Data

US 2003/0179508 A1 Sep. 25, 2003

(51) Int. Cl.$^7$ ................................................ G11B 5/39
(52) U.S. Cl. ................ 360/322; 360/324.12; 29/603.15
(58) Field of Search .......................... 360/322, 324.11, 360/324.12, 319, 313; 29/603.15

(56) References Cited

U.S. PATENT DOCUMENTS

| | | | | |
|---|---|---|---|---|
| 6,162,305 A | | 12/2000 | Hsiao et al. | |
| 6,185,078 B1 | * | 2/2001 | Lin et al. ............... | 360/324.12 |
| 6,223,420 B1 | | 5/2001 | Lee et al. | |
| 6,342,993 B1 | * | 1/2002 | Sato ........................... | 360/319 |
| 6,456,468 B1 | * | 9/2002 | Hayashi ................... | 360/324.1 |
| 6,493,194 B1 | * | 12/2002 | Sakaguchi et al. .......... | 360/322 |
| 6,525,913 B1 | * | 2/2003 | Mauri et al. ................ | 360/320 |
| 6,538,856 B1 | * | 3/2003 | Gill ............................. | 360/319 |
| 6,562,486 B2 | * | 5/2003 | Sakakima et al. .......... | 428/692 |
| 6,567,246 B1 | * | 5/2003 | Sakakima et al. ..... | 360/324.11 |
| 6,570,745 B1 | * | 5/2003 | Gill ....................... | 360/324.12 |
| 6,587,315 B1 | * | 7/2003 | Aoki et al. ................. | 360/322 |
| 6,597,547 B1 | * | 7/2003 | Kawawake et al. .... | 360/324.11 |
| 6,628,484 B2 | * | 9/2003 | Werner ....................... | 360/319 |
| 6,643,107 B1 | * | 11/2003 | Hasegawa et al. ....... | 360/324.1 |
| 6,747,852 B2 | * | 6/2004 | Lin et al. ............... | 360/324.12 |

* cited by examiner

*Primary Examiner*—Angel Castro
(74) *Attorney, Agent, or Firm*—John J. Oskorep, Esq.

(57) ABSTRACT

A magnetic head is made of a shield layer having first and second recesses defined in first and second end regions which surround a central region. Bias and lead layers are formed in the first and the second recesses, and a read sensor is formed in the central region. Advantageously, edges of the bias and lead layers are formed below edges of the read sensor to thereby define a magnetic track width of the read sensor. Also, the sensor profile is substantially flat so that a gap layer over the read sensor can provide for adequate insulation.

27 Claims, 10 Drawing Sheets

METHODS AND APPARATUS FOR DEFINING THE TRACK WIDTH OF A MAGNETIC HEAD HAVING A FLAT SENSOR PROFILE

BACKGROUND OF THE INVENTION

1. Field of the Invention

The present invention relates generally to magnetic heads and methods of making the same, and more particularly to magnetic read heads having a magnetic track width that is defined by underlying bias and lead layers and a sensor profile that is substantially flat.

2. Description of the Related Art

Higher density recording needs of future direct access storage devices (DASDs) are forcing the dimensions of magnetic heads to be well into sub-micron sizes. For example, it is predicted that for 10 gigabit (Gb) drives, the read head size should be about 0.5 um; for 20 Gb drives, the read head size should be about 0.35 um; for 40 Gb drives, the read head size should be about 0.17 um; and for 100 Gb drives, the read head size should be about 0.12 um. Such extreme resolutions make patterning techniques for the magnetic heads very difficult, especially for read heads.

One conventional method of fabricating a magnetic head utilizes a common masking and milling process. A lift-off mask is made of two layers, namely, a top photoresist layer and a bottom underlayer. This bi-layer lift-off mask is formed over the sensor materials in a central region. Ion milling is performed using the mask to remove sensor materials in end regions which surround the central region, such that a central read sensor below the lift-off mask is formed. Bias layers and lead layers are then deposited in the end regions and over the mask, and the lift-off mask is removed by dissolving the bottom underlayer. Finally, a gap layer is deposited over the read sensor and the surrounding lead layers.

The above-described technique works very well in defining sensor structures up to 0.5 um, but shows limitations beyond that size. The main issue is that the very small active region is positioned between much thicker bias and lead layers which form what is known as a contiguous junction. The ion-beam deposited leads provide a large increase in thickness very close to this junction, which creates a steep sensor profile. This steep profile results in poor coverage of the leads by the gap layer (e.g., the gap layer may crack). Thus, it is preferred that the insulator be applied over a sensor profile that is less steep.

Another existing method of fabricating a magnetic head mitigates the problem of the steep sensor profile. Using this method, a shield layer which lies underneath the bias and lead layers is formed with recesses in the end regions within which the bias and lead layers are deposited. Since the surrounding layers are sunken into the recesses, the sensor profile is less steep and the insulator's coverage of the leads is not compromised. Even another existing method utilizes the lead film, as opposed to the bias film, to define the magnetic track width (TW) of the read sensor. This technique is similar to the lift-off mask technique where the read sensor is formed via ion milling and bias layers are deposited in the end regions, but in a subsequent lithographic step the leads are fabricated inside the bias film and separated by a distance of the preferred TW.

Although these existing methods resolve some issues with respect to read head fabrication, what are needed are improved methods and apparatus for defining the magnetic track width and forming a substantially flat sensor profile of a magnetic head.

SUMMARY OF THE INVENTION

One magnetic head described herein is made with a shield layer having first and second recesses defined in first and second end regions which surround a central region. Bias and lead layers are deposited in the first and the second recesses, and a read sensor is formed in the central region. Advantageously, edges of the bias and lead layers are formed below edges of the read sensor to thereby define a magnetic track width for the read sensor. Also, the sensor profile is substantially flat so that a gap layer formed over the read sensor can provide a good insulator coverage. Methods of making such a magnetic head are also described.

BRIEF DESCRIPTION OF THE DRAWINGS

For a fuller understanding of the nature and advantages of the present invention, as well as the preferred mode of use, reference should be made to the following detailed description read in conjunction with the accompanying drawings:

FIG. 5 is a partial elevation view of the slider and magnetic head as seen in plane V—V of FIG. 2;

DETAILED DESCRIPTION OF THE PREFERRED EMBODIMENTS

The following description is the best embodiment presently contemplated for carrying out the present invention. This description is made for the purpose of illustrating the general principles of the present invention and is not meant to limit the inventive concepts claimed herein.

Figure 1:
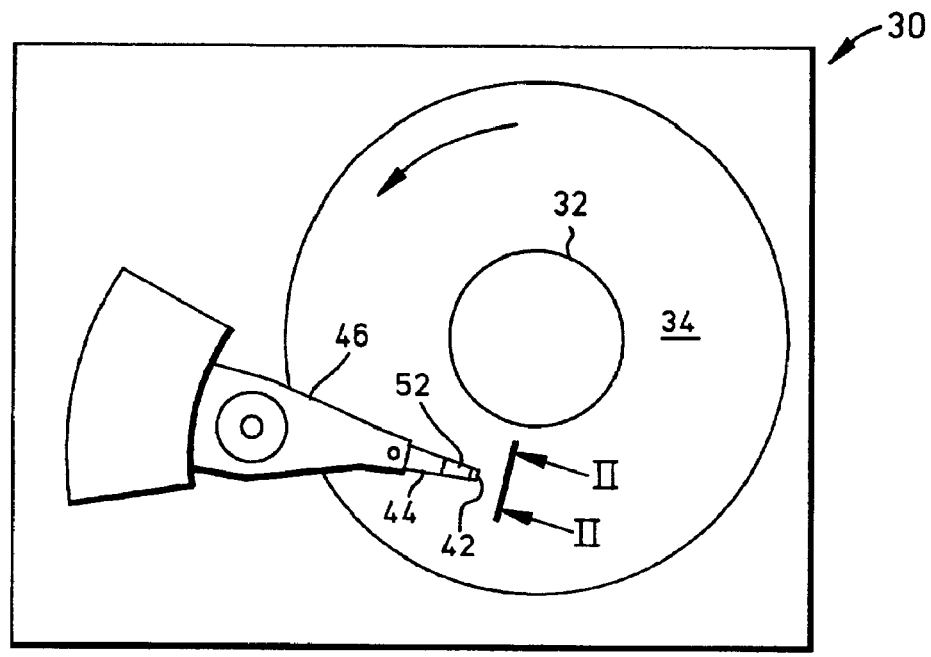
FIG. 1 is a planar view of an exemplary magnetic disk drive.
Figure 2:
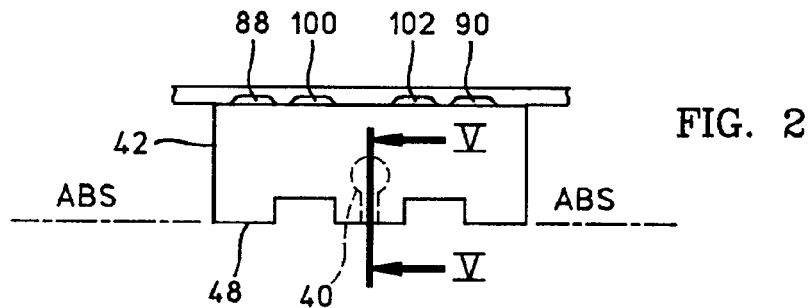
FIG. 2 is an end view of a slider with a magnetic head of the disk drive as seen in plane II—II of FIG. 1.
Figure 3:
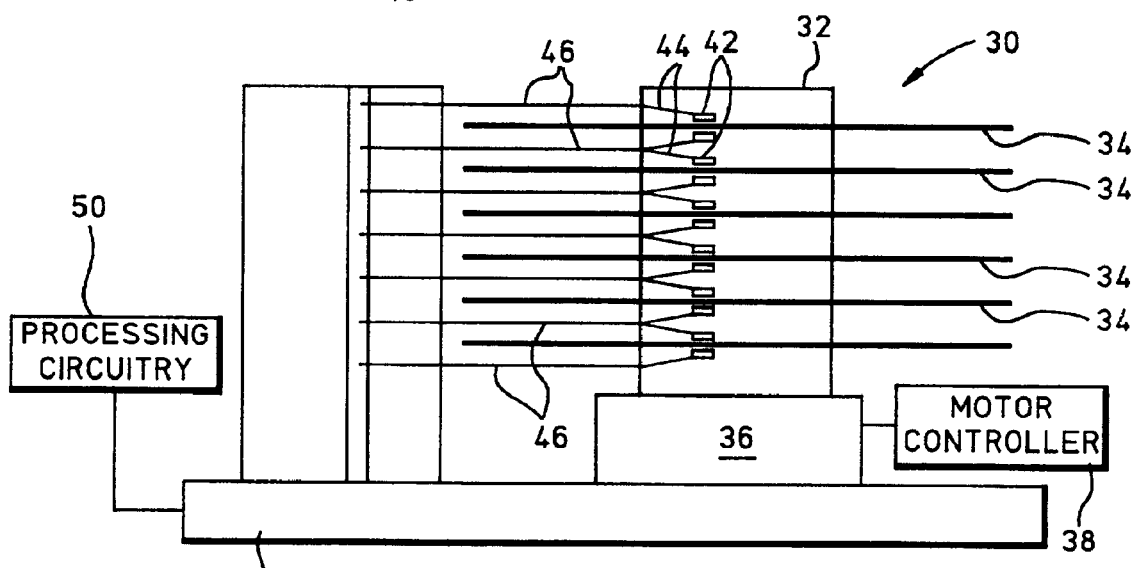
FIG. 3 is an elevational view of the magnetic disk drive wherein multiple disks and magnetic heads are employed.

Referring now to the drawings, wherein like reference numerals designate like or similar parts throughout the several views, as is illustrated in FIGS. 1–3 a magnetic disk drive 30. Disk drive 30 includes a spindle there that supports and rotates a magnetic disk 34. Spindle 32 is rotated by a motor 36 that, in turn, is controlled by a motor controller 38. A horizontal combined magnetic head 40 for reading and recording is mounted on a slider 42. Slider 42 is supported by a suspension 44 and actuator arm 46. A plurality of disks, sliders and suspensions may be employed in a large capacity direct access storage device (DASD), as shown in FIG. 3. Suspension 44 and actuator arm 46 position slider 42 to locate magnetic head 40 in a transducing relationship with a surface of magnetic disk 34. When disk 34 is rotated by motor 36, slider 42 is supported on a thin (typically, 0.02 micrometer) cushion of air (or air bearing) between disk 34 and an air bearing surface (ABS) 48.

Figure 4:
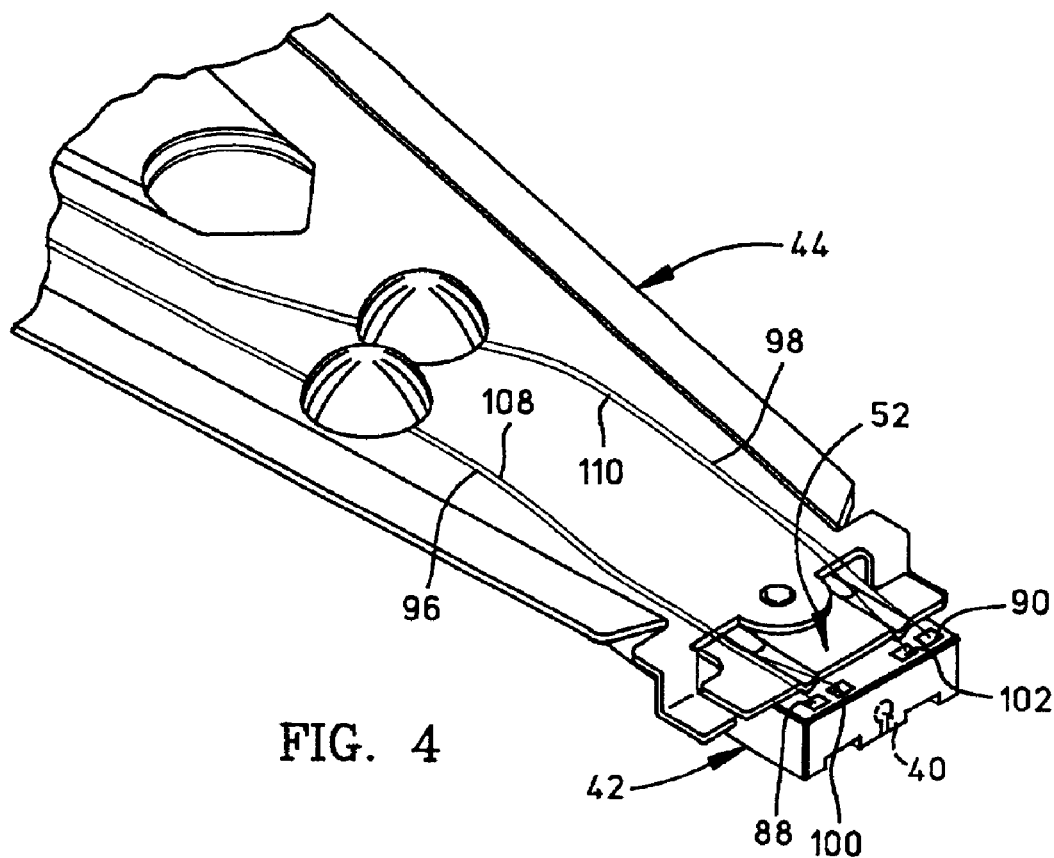
FIG. 4 is an isometric illustration of an exemplary suspension system for supporting the slider and magnetic head.

Magnetic head 40 may be employed for writing information to multiple circular tracks on the surface of disk 34, as well as for reading information therefrom. Processing circuitry 50 exchanges signals representing such information with magnetic head 40, provides motor drive signals, and also provides control signals for moving slider 42 to various tracks. In FIGS. 1 and 4, slider 42 is shown mounted to a head gimbal assembly (HGA) 52 that is mounted to suspension 44. All of the above components are supported on a base 53.

Figure 7:
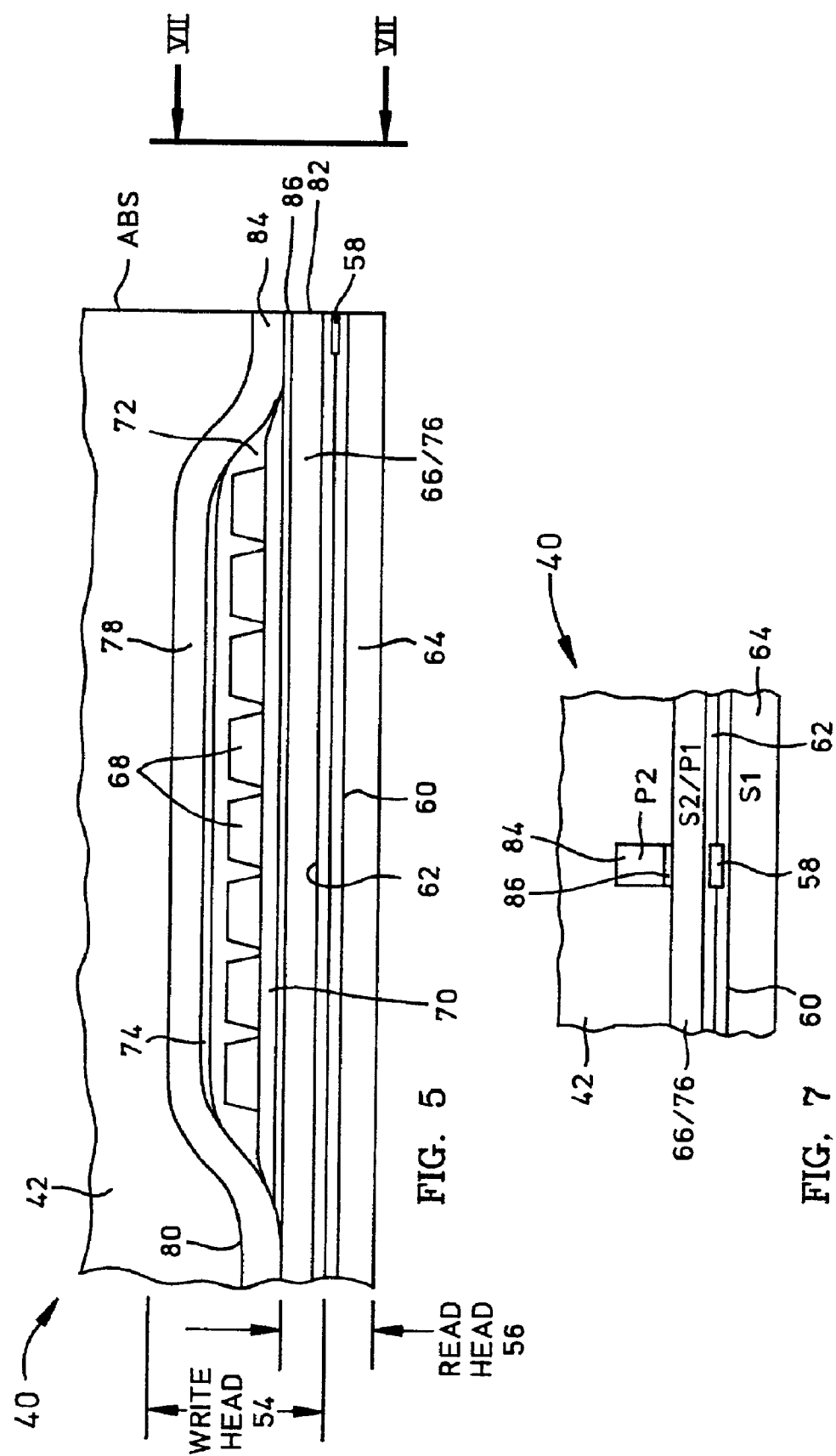
FIG. 7 is a partial ABS view of the slider taken along plane VII—VII of FIG. 5 to show the read and write elements of the magnetic head.

FIG. 5 is a side cross-sectional elevation view of a merged read/write head 40 which has a write head portion 54 and a read head portion 56. Note also the partial ABS view of head 40 in FIG. 7. Read head portion includes a giant magnetoresistive read (GMR) sensor 58. GMR sensor 58 is sandwiched between first and second gap layers 60 and 62 that are, in turn, sandwiched between first and second shield layers 64 and 66. In response to external magnetic fields, the resistance of GMR sensor 58 changes. A sense current conducted through the sensor causes these resistance changes to be manifested as potential changes, which are processed by processing circuitry 50 (FIG. 3).

Figure 6:
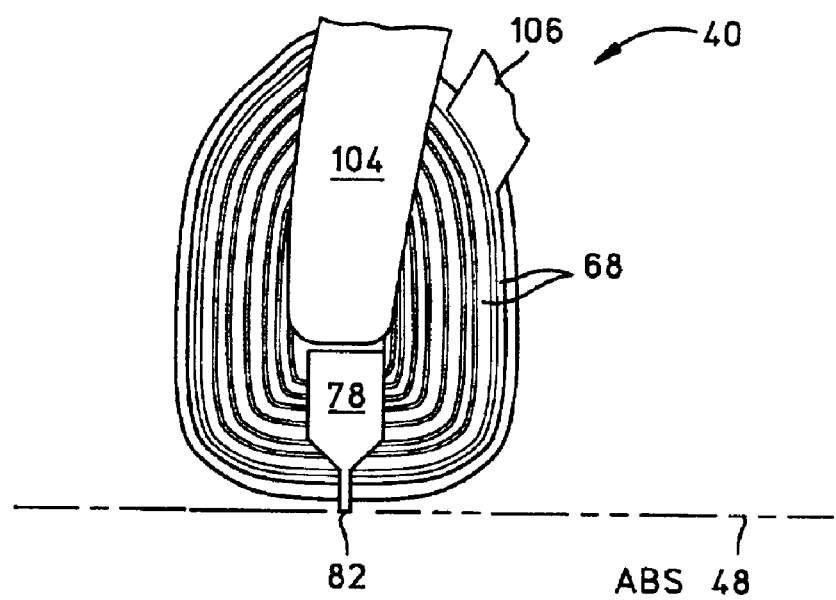
FIG. 6 is a top view of the second pole piece and coil layer, a portion of which is shown in FIG. 5, with all insulation material removed.

Write head portion 54 of the head includes a coil layer 68 sandwiched between first and second insulation layers 70 and 72. A third insulation layer 74 may be employed for planarizing the head to eliminate ripples in the second insulation layer caused by coil layer 68. The first, second and third insulation layers are referred to as an "insulation stack". Coil layer 68, and first, second and third insulation layers 70, 72 and 74, are sandwiched between first and second pole piece layers 76 and 78. The first and second pole piece layers 76 and 78 are magnetically coupled at a back gap 80, and have first and second pole tips 82 and 84 that are separated by a non-magnetic gap layer 86 at the ABS. As shown in FIGS. 2 and 4, first and second solder connections 88 and 90 connect leads (not shown) from GMR sensor 58 to leads 96 and 98 on suspension 44; third and fourth solder connections 100 and 102 connect leads 104 and 106 from coil 68 (see FIG. 6) to leads 108 and 110 on the suspension.

Figure 8:
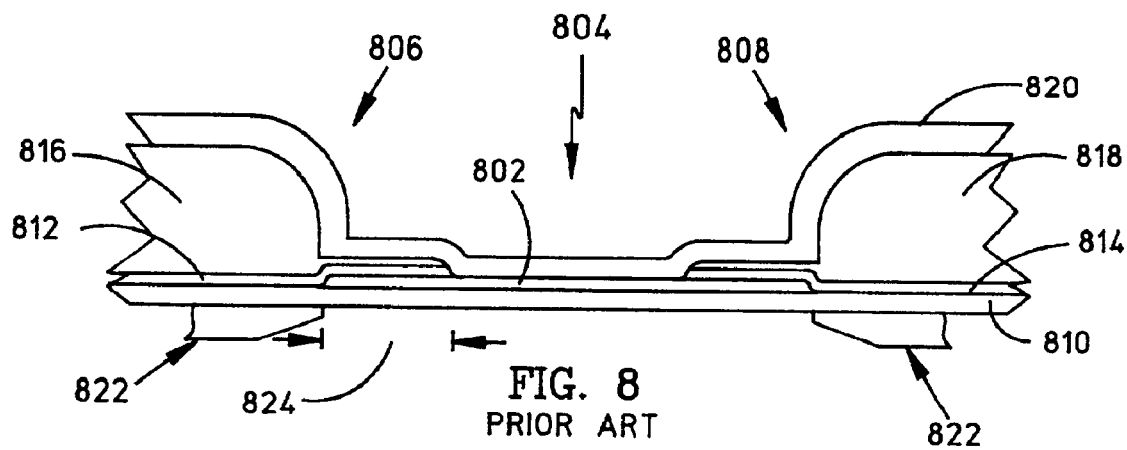
FIG. 8 is a cross-sectional view of a magnetic head of the prior art.
Figure 9:
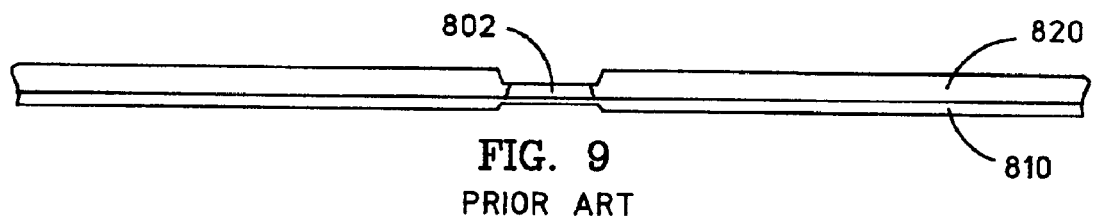
FIG. 9 is an expanded cross-sectional view of the magnetic head of FIG. 8.

FIG. 8 is a cross-sectional view of a magnetic head of the prior art which may be utilized in conventional disk drive 30. This design may be referred to as the "sunken prefill" design. The magnetic head in FIG. 8 has a read sensor 802 formed in a central region 804, which is surrounded by end regions 806 and 808. Read sensor 802 is formed over a flat surface of a gap layer 810. Bias layers 812 and 814 are formed in end regions 806 and 808 directly over gap layer 810 and over the edges of read sensor 802. Lead layers 816 and 818 are also formed in end regions 806 and 808, but directly over bias layers 812 and 814 and over the edges of bias layers 812 that cover the edges of read sensor 802. Lead layers 816 and 818 are generally positioned at a height above read sensor 802. A gap layer 820 is formed over lead layers 816 and 818 and read sensor 802. FIG. 9 is an expanded cross-sectional view of this magnetic head.

As shown, the magnetic head of FIGS. 8 and 9 has a steep sensor profile which may result in a poor coverage of lead layers 816 and 820 by gap layer 820, which may result in an electrical short between the lead and shield layers. Also, although a prefiller 822 is formed underneath gap layer 820, there are regions such as a region 824 where possible electrical shorts can occur between the contiguous junction and the prefill.

Figure 10:
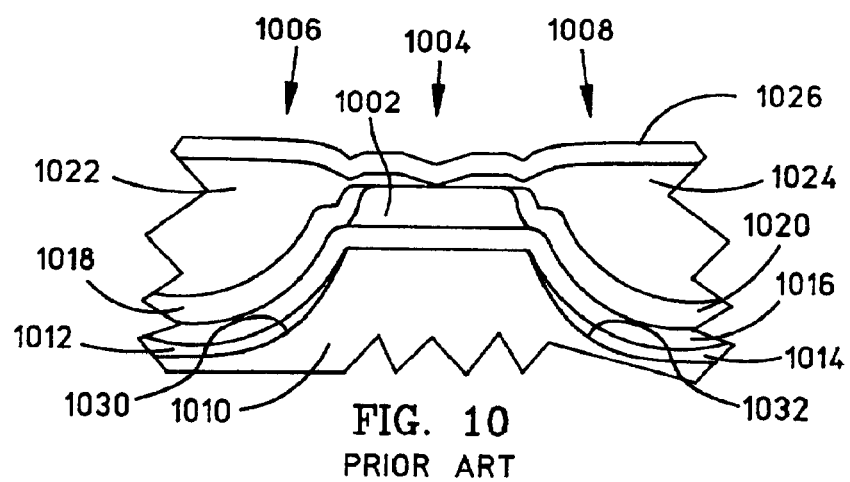
FIG. 10 is a cross-sectional view of another magnetic head of the prior art.

Another prior art magnetic head is shown in FIG. 10. This design may be referred to as the "sunken lead" design. The magnetic head of FIG. 10 has a read sensor 1002 formed in a central region 1004 which is surrounded by end regions 1006 and 1008. Read sensor 1002 is generally formed over a shield layer 1010 having recesses 1030 and 1032 in end regions 1006 and 1008. Prefill layers 1012 and 1014 are formed in recesses 1030 and 1032 directly over shield layer 1010. A gap layer 1016 is formed in end regions 1006 and 1008 directly over insulator layers 1012 and 1014 and in central region 1004 over shield layer 1010. Read sensor 1002 is formed in central region 1004 upon this gap layer 1016. Bias layers 1018 and 1020 are formed in recesses 1030 and 1032 directly over gap layer 1016 and make contact with top edges of read sensor 1002. Lead layers 1022 and 1024 are also formed in recesses 1030 and 1032 but directly over bias layers 1018 and 1020 and over the sides of read sensor 1002. A gap layer 1026 is formed over lead layers 1022 and 1024 and read sensor 1002. With this construction, the magnetic head has a sensor profile that is relatively flat (e.g., compare with the sensor profile in FIG. 8).

Figure 11:
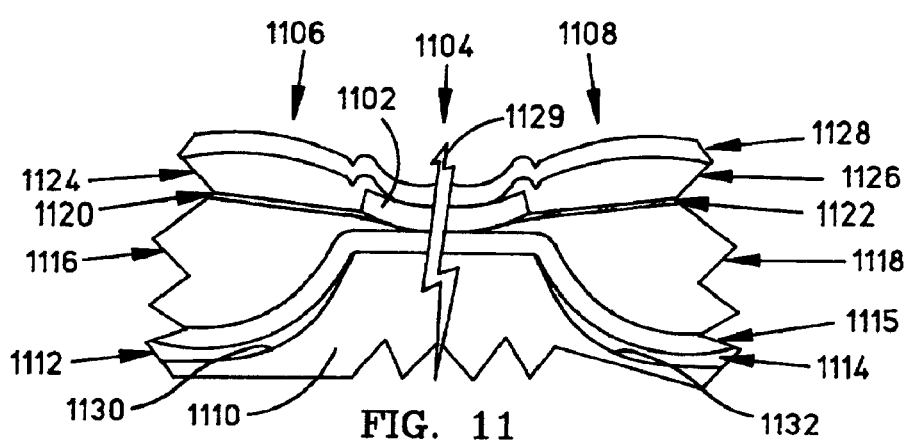
FIG. 11 is a cross-sectional view of one embodiment of a magnetic head of the present invention.

Referring now to the present invention, FIG. 11 is a cross-sectional view of a magnetic head in one inventive embodiment. The magnetic head of FIG. 11 has a read sensor 1102 formed in a central region 1104 which is surrounded by end regions 1106 and 1108. Read sensor 1102 generally receives signals 1129 for reading data from a recording medium, such as a disk. Read sensor 1102 may be a giant magnetoresisitive (GMR) sensor. Bias layers 1124 and 1126 are formed in end regions 1106 and 1108, respectively, adjacent to read sensor 1102. A gap layer 1128 is disposed directly over bias layers 1124 and 1126 and read sensor 1102, which form a sensor profile that is substantially flat (compare with the sensor profile in FIG. 8). Having a flat sensor profile is advantageous because it results in a better insulator coverage by gap layer 1128.

Directly underneath bias layers 1124 and 1126 are another pair of bias layers 1120 and 1122, respectively. Directly underneath these bias layers 1120 and 1122 are lead layers 1116 and 1118, respectively. Lead layers 1116 and 1118 are disposed generally below read sensor 1102 in recesses 1130 and 1132, which are originally formed by a shield layer 1110. Prefill layers 1112 and 1114 are formed in recesses 1130 and 1132 over shield layer 1110, and a gap layer 1115 is formed in recesses 1130 and 1132 over prefill layers 1112 and 1114 and over shield layer 1110 in central region 1104. Lead layers 1116 and 1118 are formed in recesses 1130 and 1132 directly over this gap layer 1115.

As shown, bias layers 1120 and 1122 have edges which are disposed directly underneath the edges of read sensor 1102. Similarly, lead layers 1116 and 1118 have edges which are disposed directly underneath the edges of bias layers 1120 and 1122 and underneath read sensor 1102. The positions of these underlying edges of bias and lead layers 1116, 1118, 1120, and 1122 relative to the edges of read sensor 1102 define a magnetic track width (TW) for read sensor 1102. More particularly, the ends of the edges of bias and lead layers 1116 and 1120 define one side of the magnetic TW, and the ends of the edges of bias and lead layers 1118 and 1122 define the other side of the magnetic TW.

Bias layers 1120, 1122, 1124, and 1126 may be made of any suitable magnetic material, such as cobalt-platinum-chromium; lead layers 1116 and 1118 may be made of any suitable conductive material, such as gold, tungsten, rhodium, or tantalum; gap layers 1115 and 1128 may be made of any suitable insulator material, such as alumina; and shield layer 1110 may be made of any suitable soft magnetic material, such as Permalloy.

Figure 12:
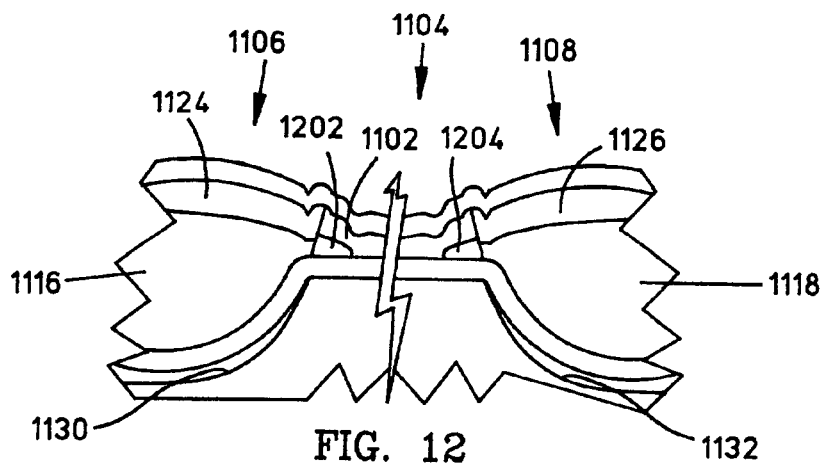
FIG. 12 is a cross-sectional view of another embodiment of the magnetic head.
Figure 13:
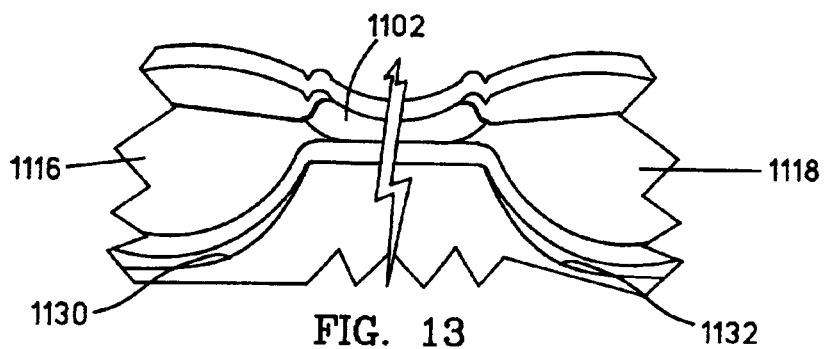
FIG. 13 is a cross-sectional view of even another embodiment of the magnetic head.

FIG. 12 is a cross-sectional view of a magnetic head in another embodiment. The magnetic head of FIG. 12 is the same as that described in relation to FIG. 11, except that the magnetic head in FIG. 12 has bias layers 1202 and 1204 that are relatively short and not formed entirely over end regions 1106 and 1108. Bias layers 1202 and 1204 are formed underneath the edges of read sensor 1102 and above lead layers 1116 and 1118. The edges of bias and lead layers 1116, 1118, 1202, and 1204 define the magnetic TW for read sensor 1102. FIG. 13 is a cross-sectional view of a magnetic head in a similar alternate embodiment. The magnetic head of FIG. 13 is also the same as that described in relation to FIG. 11, except that the magnetic head in FIG. 13 has no bias layers or edges formed underneath read sensor 1102. Here, only the edges of lead layers 1116 and 1118 define the magnetic TW.

Figure 14:
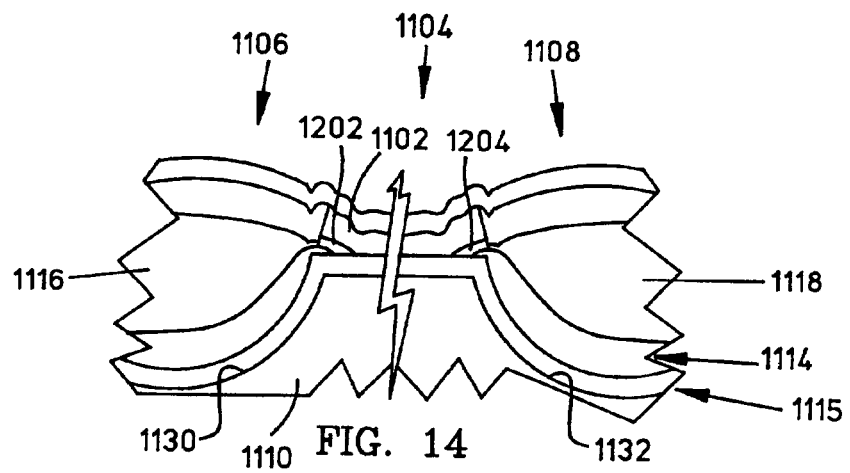
FIG. 14 is a cross-sectional view of yet even another embodiment of the magnetic head.
Figure 15:
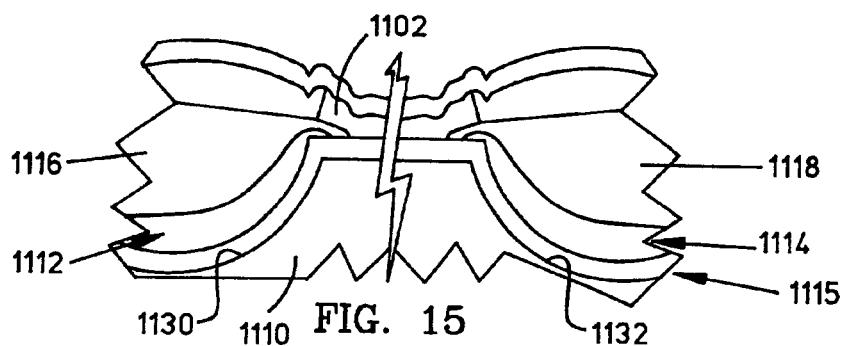
FIG. 15 is a cross-sectional view of another embodiment of the magnetic head.

FIG. 14 is a cross-sectional view of a magnetic head in even another embodiment. The magnetic head of FIG. 14 is the same as that described in relation to FIG. 12, except that the magnetic head in FIG. 14 has gap layer 1115 formed directly over shield layer 1110 and prefill layers 1112 and 1114 formed in end regions 1106 and 1108 directly over gap layer 1115. FIG. 15 is a cross-sectional view of a magnetic head in a similar alternate embodiment. The magnetic head of FIG. 15 is the same as that described in relation to FIG. 4, except that the magnetic head in FIG. 15 also has gap layer 1115 formed directly over shield layer 1110 and prefill layers 1112 and 1114 formed in end regions 1106 and 1108 directly over this gap layer 1115. In the heads of FIGS. 14 and 15, extra insulator coverage can be provided continuously up to the edges of the leads to reduce the possibility of electrical shorts (see discussion of FIG. 8).

Figure 16:
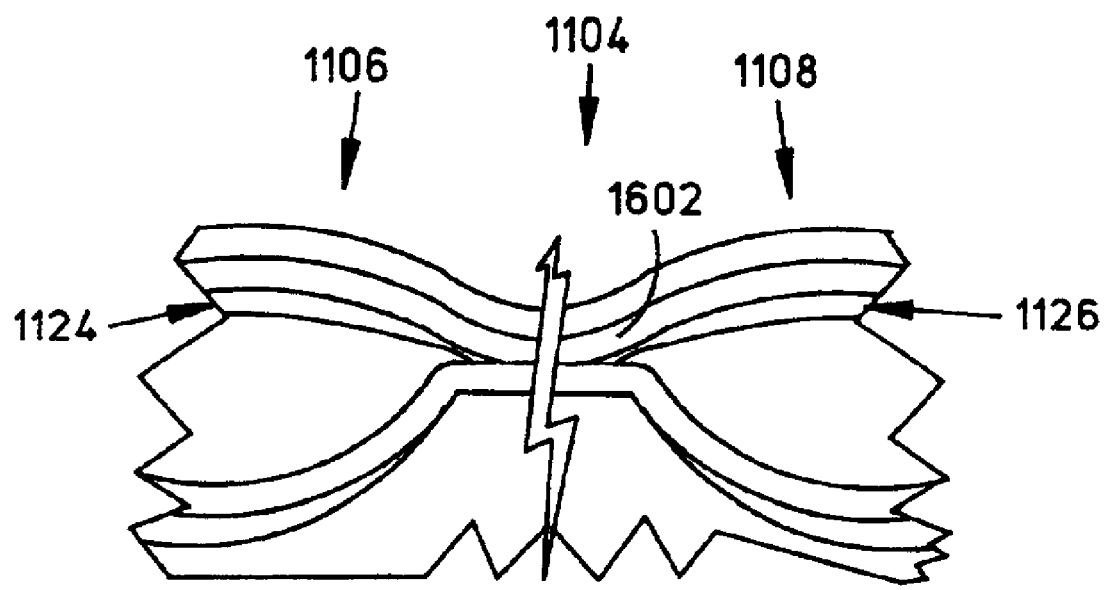
FIG. 16 is a cross-sectional view of even another embodiment of the magnetic head.
Figure 17:
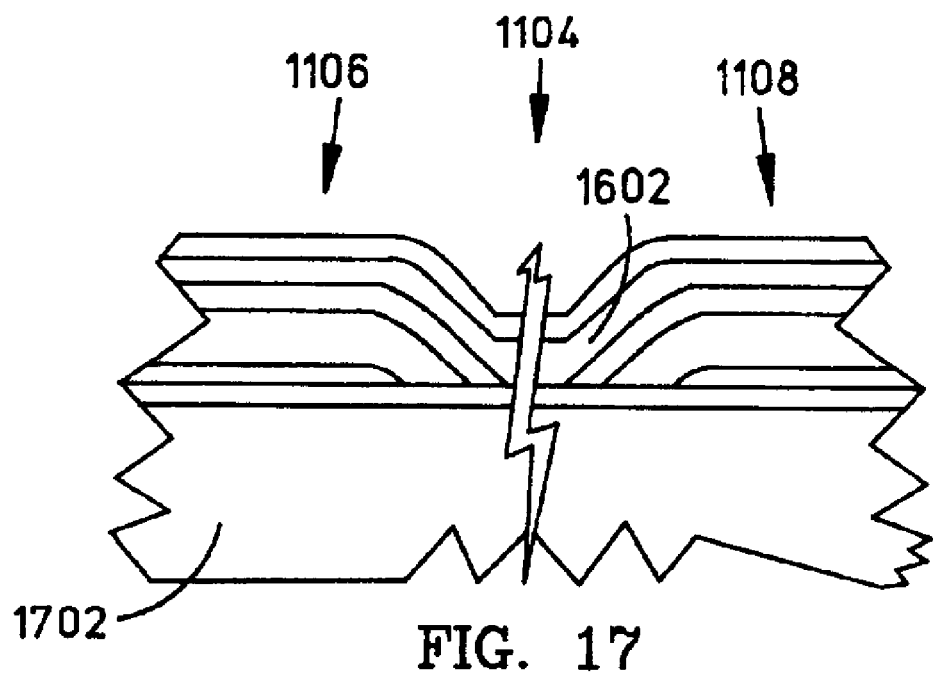
FIG. 17 is a cross-sectional view of yet even another embodiment of the magnetic head.
Figure 18:
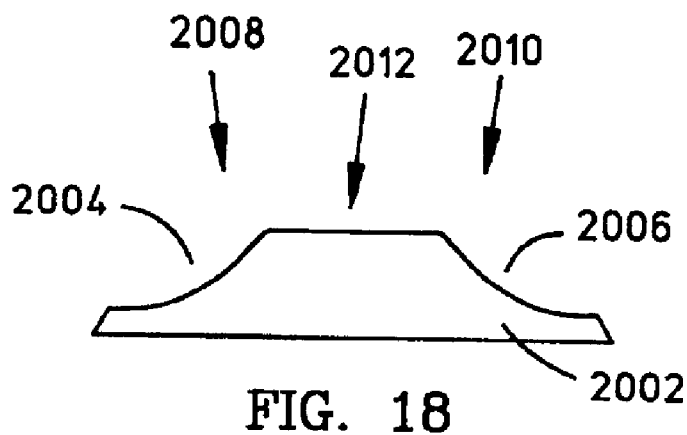
FIG. 18 is the first of a series of cross-sectional views of FIGS. 18–29 which relate to a method of making a magnetic head, which in FIG. 18 shows a shield layer formed with recesses in end regions.

FIG. 16 is a cross-sectional view of a magnetic head in even another embodiment. The magnetic head of FIG. 16 is the same as that described in relation to FIG. 11, except that read sensor 1602 is not only formed in central region 1104 but also in end regions 1106 and 1108 over bias layers 1124 and 1126. Also, additional bias layers (e.g., bias layers 1124 and 1126 of FIG. 11) are not necessary for an adequate design. The edges of bias and lead layers 1116, 1118, 1120, and 1122 define the magnetic TW for read sensor 1602. FIG. 17 is a cross-sectional view of a magnetic head in a similar embodiment. The magnetic head of FIG. 17 is the same as that described in relation to FIG. 16, except that a different shield layer 1702 with no recesses in end regions 1106 and 1108 is utilized. Here, the gap, lead, and bias layers are instead formed over the flat shield layer 1702. In this embodiment, the magnetic head does not have a sensor profile that is flat as those described in relation to FIGS. 11–16, but favorable properties are still provided.

An inventive method of forming a magnetic head will now be described in relation to FIGS. 18–29. In particular, the formation of the magnetic head of FIG. 11 will be discussed. Beginning with FIG. 18, a shield layer 2002 is formed over a substrate. Shield layer 2002 may be made of any suitable soft magnetic material, such as Permalloy. As shown, shield layer 2002 has recesses 2004 and 2006 formed in end regions 2008 and 2010, respectively, which surround a central region 2012. Recesses 2004 and 2006 may be formed in shield layer 2002 using conventional photolithography and milling techniques. Preferably, the thickness of shield layer 2012 in central region 2012 is about 2 microns.

Figure 19:
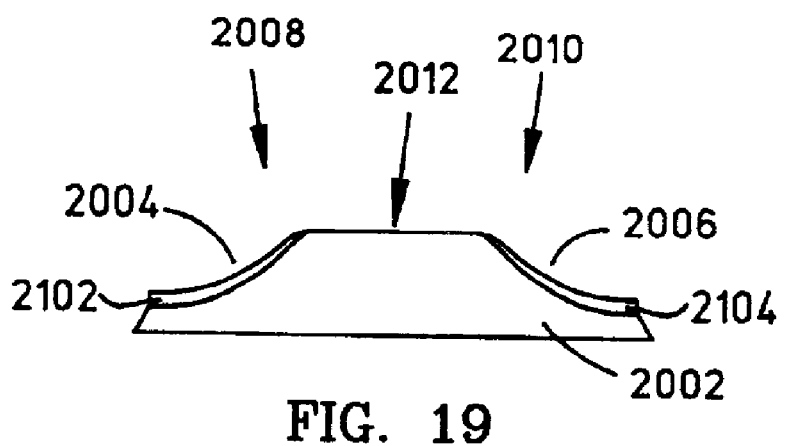
FIG. 19 is the same as that shown in FIG. 18, except that insulator layers are formed over the shield layer in the recesses.

In FIG. 19, prefill layers 2102 and 2104 are formed in end regions 2008 and 2010, respectively, over shield layer 2002. The top of shield layer 2002 in central region 2012 remains exposed. These prefill layers 2102 and 2104 are formed by leaving on the photoresist mask that was used to form recesses 2004 and 2006 in shield layer 2002, depositing prefill layers 2102 and 2104 over shield layer 2012 and the photoresist mask, and then removing the photoresist mask. Prefill layers 2102 and 2104 may be made of any suitable insulating material, such as alumina. Preferably, the thickness of each prefill layer 2102 and 2104 is between 200 and 300 Angstroms.

Figure 20:
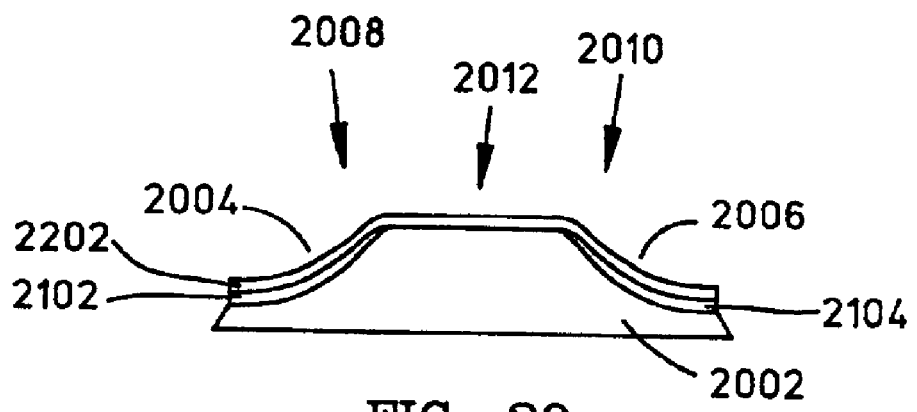
FIG. 20 is the same as that shown in FIG. 19, except that a gap layer is formed over the insulator layers in the end regions and over the shield layer in the central region.

In FIG. 20, a gap layer 2202 is then deposited over prefill layers 2102 and 2104 in end regions 2008 and 2010 and over shield layer 2002 in central region 2012. Gap layer 2202 may be made of any suitable insulating material, such as tantalum oxide or silicon dioxide. Preferably, the thickness of this gap layer 2202 is between about 100 and 400 Angstroms.

Figure 21:
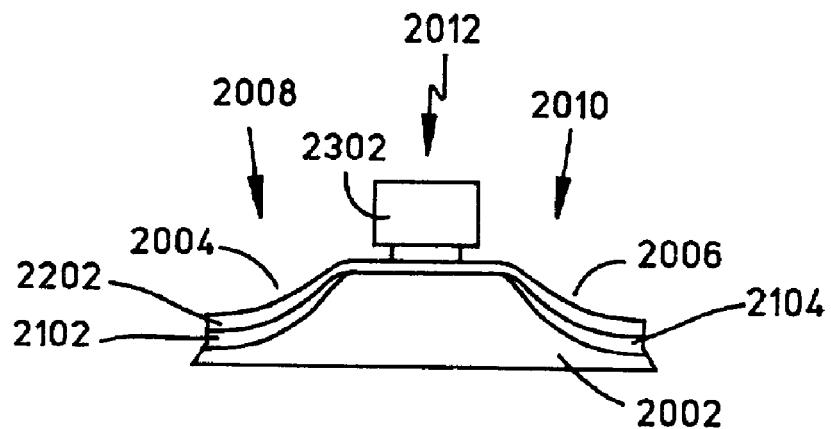
FIG. 21 is the same as that shown in FIG. 20, except that a lift-off mask is formed in the central region.

Next, in FIG. 21, a lift-off mask 2302 is formed in central region 2012 over gap layer 2202. Lift-off mask 2302 may be a conventional lift-off mask which is formed using well-known deposition and etching techniques. The lift-off mask may be, for example, a bi-layer lift-off mask having a top photoresist layer and a bottom underlayer. For a description of this lift-off mask and others, see U.S. Pat. No. 6,218,056B1 which is hereby incorporated be reference herein.

Figure 22:
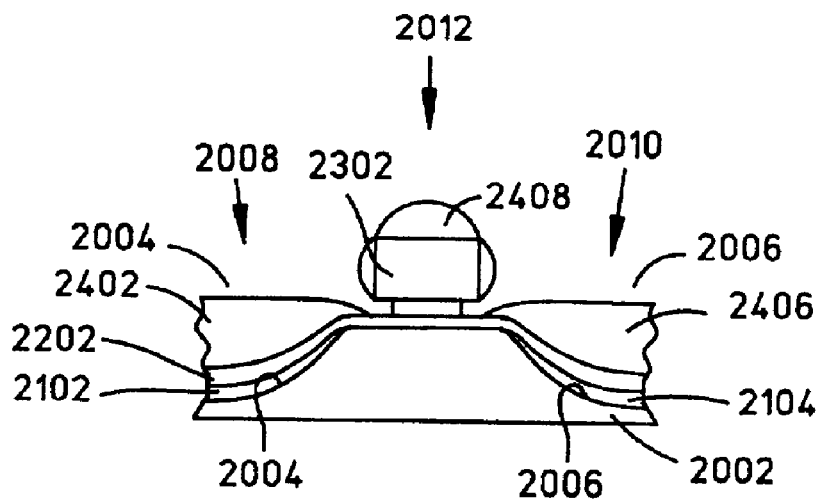
FIG. 22 is the same as that shown in FIG. 21, except that lead layers are deposited in the end regions.

Next, in FIG. 22, lead layers 2402 and 2406 are deposited in recesses 2004 and 2006 over gap layer 2202. Lead material 2408 is also formed over the top of lift-off mask 2302. Lead layers 2402 and 2406 may be made of any suitable conductive material, such as gold, tungsten, rhodium, or tantalum. Preferably, each lead layer 2402 and 2406 is deposited to a thickness of between 400 and 700 Angstroms.

Figure 23:
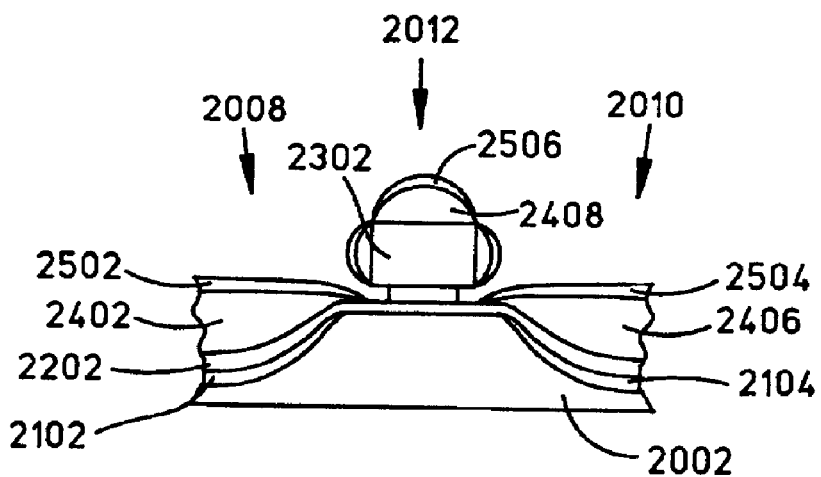
FIG. 23 is the same as that shown in FIG. 22, except that bias layers are deposited in the end regions over the lead layers.

In FIG. 23, bias layers 2502 and 2504 may be deposited in end regions 2008 and 2010, respectively, over lead layers 2402 and 2406, respectively. Bias material 2506 is also formed over the top of lead material 2408 on lift-off mask 2302. Bias layers 2502 and 2504 may be made of any suitable magnetic material, such as cobalt-platinum-chromium. Preferably, bias layer 2502 and 2504 is deposited to a thickness of between 150 and 250 Angstroms. Alternatively, the step of depositing these bias layers 2502 and 2504 is skipped so that no underlying bias layers exist (e.g., see FIGS. 13 and 15).

Figure 24:
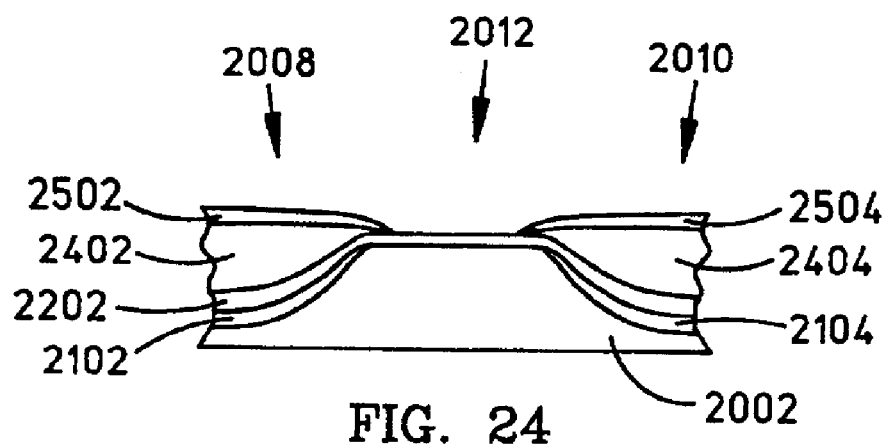
FIG. 24 is the same as that shown in FIG. 23, except that the lift-off mask is removed.

Lift-off mask 2302 is then removed using a stripper solution to dissolve the underlayer, and the resulting structure is shown in FIG. 24. Although lead and bias layers 2402, 2404, 2502, and 2504 are generally formed in end regions 2008 and 2010, thin edges of these layers are formed on the outskirts of central region 2012. Also, a small recess is formed in central region 2012.

Figure 25:
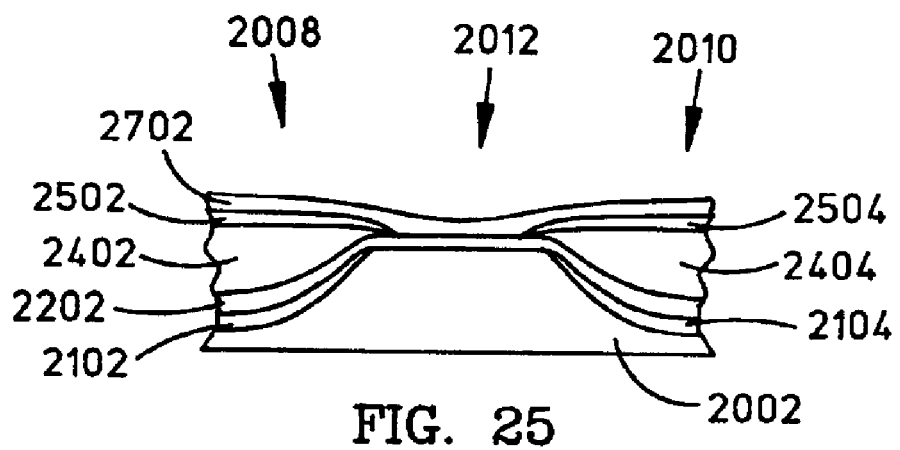
FIG. 25 is the same as that shown in FIG. 24, except that sensor materials are deposited over the resulting structure.
Figure 26:
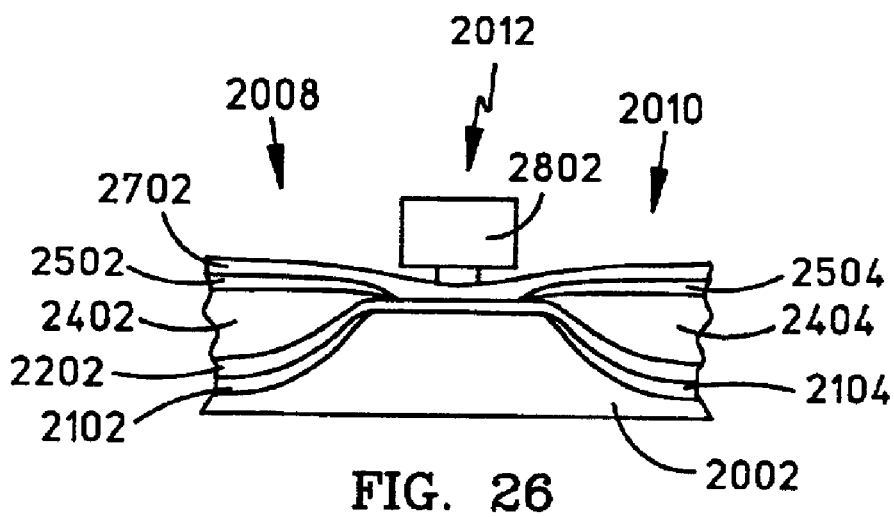
FIG. 26 is the same as that shown in FIG. 25, except that another lift-off mask is formed in the central region.

Next, in FIG. 25, sensor materials 2702 are deposited over bias layers 2502 and 2504 in end regions 2008 and 2010 and over gap layer 2202 in central region 2012. GMR sensor materials 2702 may include several common materials such as nickel-iron and cobalt-iron to name a few. As shown in FIG. 26, another lift-off mask 2802 is formed in central region 2012 over sensor materials 2702. Lift-off mask 2802 may be a conventional bi-layer lift-off mask as described above.

Figure 27:
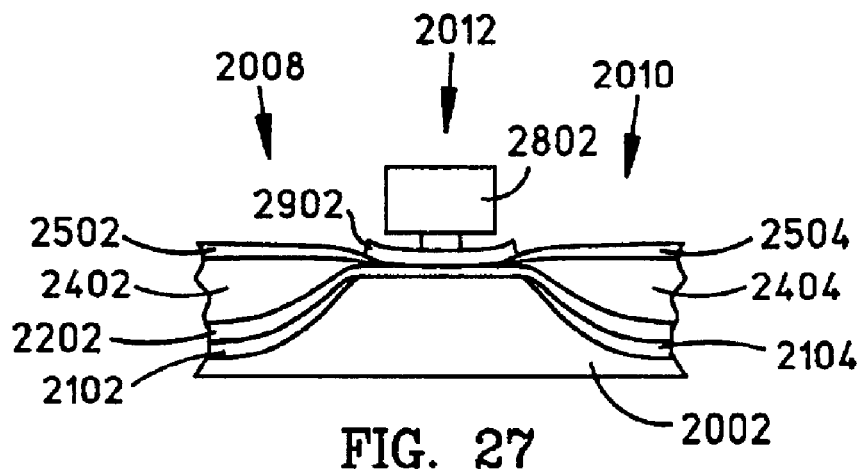
FIG. 27 is the same as that shown in FIG. 26, except that ion milling was performed to form a read sensor in the central region.

In FIG. 27, ion milling is performed such that sensor materials 2702 in end regions 2008 and 2010 are removed and a read sensor 2902 in central region 2012 remains. One edge of read sensor 2902 remains over edges of lead and bias layers 2402 and 2502, and the other edge of read sensor 2902 remains over edges of lead and bias layers 2404 and 2504. The positions of these edges define a magnetic track width for read sensor 2902. The magnetic track width may be defined to be between 0.1 µm and 0.3 µm. To compare, the physical or mechanical track width of read sensor 2902 may be between 0.15 um and 0.4 um.

This ion milling may be continued even after the sensor materials in end regions 2008 and 2010 are removed, in order to remove most of bias layers 2502 and 2504 in end regions 2008 and 2010 and expose the top surfaces of lead layers 2402 and 2404. If this is done, only short bias layers underneath read sensor 2902 will remain (e.g., see FIGS. 12 and 14).

Figure 28:
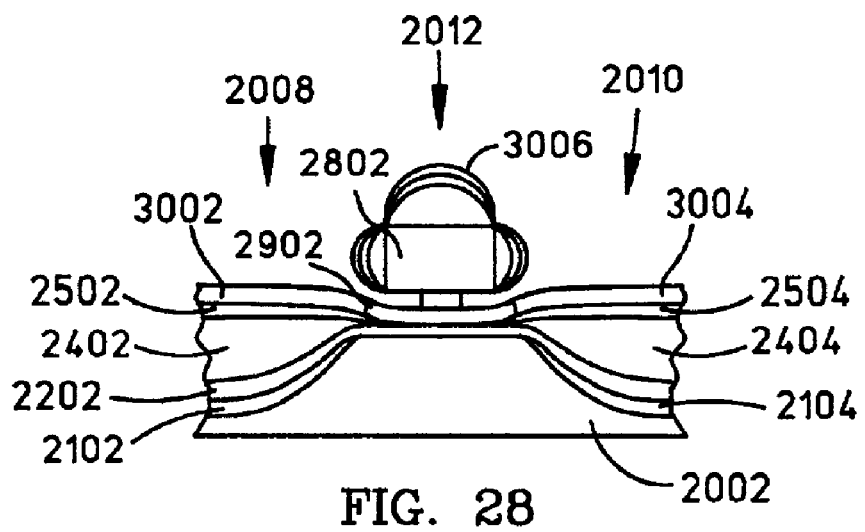
FIG. 28 is the same as that shown in FIG. 27, except that bias layers are deposited in the end regions.

In FIG. 28, another pair of bias layers 3002 and 3004 is then deposited over bias layers 2502 and 2504, respectively. Bias material 3006 is also formed on top of lift-off mask 2802. Bias layers 3002 and 3004 may be deposited to a thickness between about 150 and 250 Angstroms. Lift-off mask 2802 is then removed using a stripper solution to dissolve the underlayer.

Figure 29:
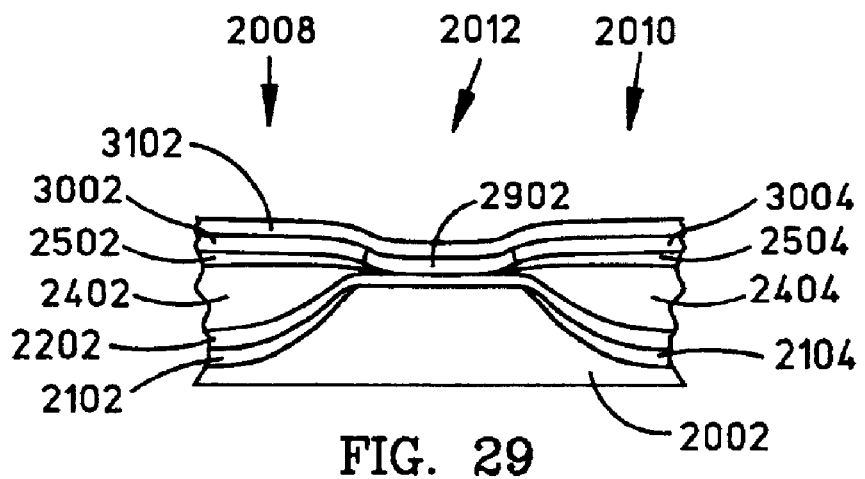
FIG. 29 is the same as that shown in FIG. 28, except that a gap layer is deposited over the bias layers in the end regions and over the read sensor in the central region.

Next, in FIG. 29, a gap layer 3102 is deposited over bias layers 3002 and 3004 in end regions 2008 and 2010 and over read sensor 2902 in central region 2012. Preferably, gap layer 3102 is deposited to a thickness between 150 and 400 Angstroms. As described, a sensor profile that is substantially flat is formed so that gap layer 3102 provides a good insulating coverage. By "substantially flat", it is more particularly meant that the distance between the lowest valley of the read sensor and the highest peak of the adjacent bias layers is no greater than 150 Angstroms.

Thus, a magnetic head is made of a shield layer having first and second recesses defined in first and second end regions which surround a central region. Bias and lead layers are formed in the first and the second recesses, and a read sensor is formed in the central region. Advantageously, edges of the bias and lead layers are formed below edges of the read sensor to thereby define a magnetic track width for the read sensor. Also, the sensor profile is substantially flat so that a gap layer over the sensor can provide a good insulator coverage.

What is claimed is:

1. A magnetic head, comprising:
   a shield layer;
   the shield layer having first and second milled recesses in first and second end regions which surround a central region;
   first and second insulator layers formed in the first and the second milled recesses;
   a gap layer formed in the first and the second end regions over the first and the second insulator layers and in the central region over the shield layer;
   a read sensor formed in the central region over the gap layer;
   first and second lead layers formed in the first and the second milled recesses of the shield layer over the gap layer and generally below the read sensor;
   first and second hard bias layers formed above the first and second lead layers;
   the first hard bias layer having an edge formed underneath a first edge of the read sensor;
   the second hard bias layer having an edge formed underneath a second edge of the read sensor;
   the first lead layer having an edge formed underneath the first edge of the read sensor; and
   the second lead layer having an edge formed underneath the second edge of the read sensor.

2. The magnetic head of claim 1, further comprising:
   third and fourth hard bias layers formed in the first and the second end regions above the first and the second hard bias layers and adjacent the read sensor.

3. The magnetic head of claim 1, wherein positions of the edges of the first and the second lead layers and the first and second hard bias layers define a track width for the read sensor.

4. A disk drive, comprising:
   a slider;
   a magnetic head supported by the slider;
   the magnetic head having:
      a shield layer;
      the shield layer having first and second milled recesses in first and second end region which surround a central region;
      first and second insulator layers formed in the first and the second milled recesses;
      a gap layer formed in the first and the second end regions over the first and the second insulator layers and in the central region over the shield layer;

a read sensor formed in the central region over the gap layer;

first and second lead layers formed in the first and the second milled recesses of the shield layer over the gap layer and generally below the read sensor;

first and second hard bias layers formed above the first and second lead layers;

the first hard bias layer having an edge formed underneath a first edge of the read sensor;

the second hard bias layer having an edge formed underneath a second edge of the read sensor;

the first lead layer having an edge formed underneath the first edge of the read sensor; and the second lead layer having an edge formed underneath the second edge of the read sensor.

5. The disk drive of claim 4, wherein the magnetic head further comprises:

third and fourth hard bias layers formed in the first and the second end regions above the first and the second lead layers and adjacent the read sensor.

6. The disk drive of claim 4, wherein positions of the edges of the first and the second lead layers and the first and second hard bias layers define a track width for the read sensor.

7. A magnetic head, comprising:

a shield layer;

the shield layer having first and second recesses in first and second end regions which surround a central region;

first and second insulator layers formed in the first and the second recesses;

a gap layer formed in the first and the second end regions over the first and the second insulator layers and in the central region over the shield layer;

first and second lead layers formed in the first and the second recesses over the gap layer;

a read sensor formed in the central region, the read sensor having:

a left portion of its bottom surface formed above and on a left portion of a top surface of the first lead layer;

a right portion of its bottom surface formed above and on a right portion of a ton surface of the second lead layer; and wherein a leftmost edge of the first lead layer and a rightmost edge of the second lead layer define a track width for the read sensor.

8. The magnetic head of claim 7, wherein the first and second lead layers are formed in the first and second recesses on the gap layer.

9. The magnetic head of claim 7, further comprising:

a sensor profile which is substantially flat.

10. The magnetic head of claim 7, further comprising:

first and second bias layers formed above the first and the second lead layers.

11. The magnetic head of claim 7, further comprising:

first and second bias layers formed in the first and the second end regions above the first and the second lead layers and adjacent the read sensor.

12. The magnetic head of claim 7, wherein the first and the second lead layers are formed generally below the read sensor.

13. The magnetic head of claim 7, further comprising:

wherein first and second recesses of the shield layer comprise first and second milled recesses.

14. The magnetic head of claim 7, further comprising:

wherein the gap layer comprises a first gap layer;

first and second bias layers formed in the first and the second end regions over the first and the second layer and adjacent the read sensor; and a second gap layer formed over the first and the second bias layer and the read sensor.

15. A disk drive, comprising:

a slider;

a magnetic head supported on the slider;

the magnetic head having:

a shield layer;

the shield layer having first and second recesses in first and second end regions which surround a central region;

first and second insulator layers formed in the first and the second recesses;

a gap layer formed in the and the second end region over the first and the second insulator layers and in the central region over the shield layer;

first and second lead layer formed in the first and the second recesses over the gap layer;

a read sensor formed in the central region, the read sensor having:

a left portion of its bottom surface formed above and on a left portion of a top surface of the first lead layer;

a right portion of its bottom surface formed above and on right portion of a top surface of the second lead layer; and wherein a leftmost edge of the first lead layer and a rightmost edge of the second lead layer define a track width for the read sensor.

16. The disk drive of claim 15, wherein the first and second lead layers are formed in the first and the second recesses on the gap layer.

17. The disk drive of claim 15, wherein the magnetic head further comprises:

a sensor profile which is substantially flat.

18. The disk drive of claim 15, wherein the magnetic head further comprises:

first and second bias layers formed above the first and the second lead layers.

19. The disk drive of claim 15, wherein the magnetic head further comprises:

first and second bias layers formed in the first and the second end regions above the first and the second lead layers and adjacent the read sensor.

20. The disk drive of claim 15, wherein the first and the second lead layers are formed generally below the read sensor.

21. The disk drive of claim 15, wherein the first and second recesses of the shield layer comprise first and second milled recesses.

22. The disk drive of claim 15, wherein the magnetic head further comprises:

wherein the gap layer comprises a first gap layer;

first and second bias layers formed in the first and the second end regions over the first and the second lead layers and adjacent the read sensor; and a second gap layer formed over the first and the second bias layers and the read sensor.

23. The disk drive of claim 22, wherein the magnetic head has a sensor profile which is substantially flat.

24. A magnetic head, comprising:

a shield layer;

the shield layer formed with first and second recesses in first and second end regions which surround a central region;

a first gap layer formed in the first and the second recesses and over the shield layer;

first and second lead layers formed in the first and the second recesses over the gap layer;

a read sensor formed in the central region, the read sensor having:

a left portion of its bottom surface formed above and on a left portion of a top surface of the first lead layer;

a right portion of its bottom surface formed above and on a right portion of a top surface of the second lead layer;

a second gap layer formed over the first and the second bias layers and the read sensor; and a sensor profile along the second gap layer being substantially flat.

25. The magnetic head of claim 24, further comprising:

first and second bias layers formed in the first and the second end regions over the first and the second lead layers and adjacent the read sensor.

26. The magnetic head of claim 24, further comprising:

third and fourth bias layers formed in the first and the second end regions over the first and the second lead layers and below the first and the second bias layers.

27. The magnetic head of claim 24, wherein a leftmost edge of the first lead layer and a rightmost edge of the second lead layer define a track width for the read sensor.

* * * * *

UNITED STATES PATENT AND TRADEMARK OFFICE
CERTIFICATE OF CORRECTION

PATENT NO. : 6,930,864 B2
DATED : August 16, 2005
INVENTOR(S) : Santini

It is certified that error appears in the above-identified patent and that said Letters Patent is hereby corrected as shown below:

Column 8,
Line 61, change "end region" to -- end regions --;

Column 9,
Line 44, change "ton" to -- top --;
Line 66, after "wherein" add -- the --;

Column 10,
Line 4, after "and the second" add -- lead --;
Line 7, change "bias layer" to -- bias layers --;
Line 20, after "formed in the" add -- first --;
Line 20, change "region" to -- regions --;
Line 23, change "layer" to -- layers --.

Signed and Sealed this

Twenty-second Day of November, 2005

JON W. DUDAS
*Director of the United States Patent and Trademark Office*